United States Patent [19]

Kinoshita et al.

[11] Patent Number: 4,967,241

[45] Date of Patent: Oct. 30, 1990

[54] SEMICONDUCTOR LIGHT EMITTING DEVICE

[75] Inventors: Hideaki Kinoshita; Toshiaki Tanaka, both of Yokohama, Japan

[73] Assignee: Kabushiki Kaisha Toshiba, Kawasaki, Japan

[21] Appl. No.: 432,359

[22] Filed: Nov. 6, 1989

Related U.S. Application Data

[63] Continuation of Ser. No. 843,658, Mar. 26, 1986, abandoned.

[30] Foreign Application Priority Data

Mar. 26, 1985 [JP] Japan .................................. 60-61480

[51] Int. Cl.$^5$ ........................ H01L 3/12; H01L 31/16
[52] U.S. Cl. ........................................ 357/19; 357/17; 357/30
[58] Field of Search ............. 357/19, 17, 30 M, 30 B, 357/30 D, 30 E, 30 G, 30 P, 30 Q; 250/211 J; 350/96.11; 372/50

[56] References Cited

U.S. PATENT DOCUMENTS

| 4,275,404 | 6/1981 | Cassiday et al. | 357/19 |
| 4,284,884 | 8/1981 | Dyment et al. | 357/19 X |
| 4,470,143 | 9/1984 | Kitamura et al. | 357/19 X |
| 4,605,943 | 8/1986 | Nakamura et al. | 357/19 X |
| 4,614,958 | 9/1986 | Mikami et al. | 357/19 |
| 4,653,058 | 3/1987 | Akiba et al. | 357/19 X |

FOREIGN PATENT DOCUMENTS

| 51-132983 | 11/1976 | Japan |  |
| 54-99586 | 8/1979 | Japan | 357/19 |
| 56-6480 | 1/1981 | Japan | 357/19 |
| 57-30389 | 2/1982 | Japan | 357/19 |
| 58-153378 | 9/1983 | Japan | 357/19 |

OTHER PUBLICATIONS

Sze, S. M., Physics of Semiconductor Devices, John Wiley, 1981, pp. 708–710, 759–763, 398–402.

Burrus et al., "Small-Area Double-Heterostructure Aluminum-Gallium Arsenide Electroluminescent Diode Sources for Optical-Fiber Transmission Lines," Optics Communication, vol. 4, No. 4, Dec. 1971.

Primary Examiner—Andrew J. James
Assistant Examiner—Sara W. Crane
Attorney, Agent, or Firm—Finnegan, Henderson, Farabow, Garrett, and Dunner

[57] ABSTRACT

A semiconductor light emitting device has a semiconductor light emitting element section and an n-type semiconductor substrate with a through hole which serves as a window through which light generated by the semiconductor light emitting element section is emitted. The device further includes a p-type region formed in the semiconductor substrate and facing the through hole. The p-type region and the semiconductor substrate constitute a photodiode.

12 Claims, 4 Drawing Sheets

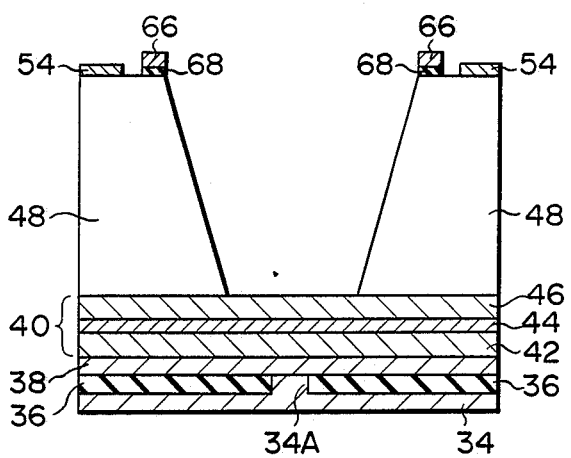
F I G. 4
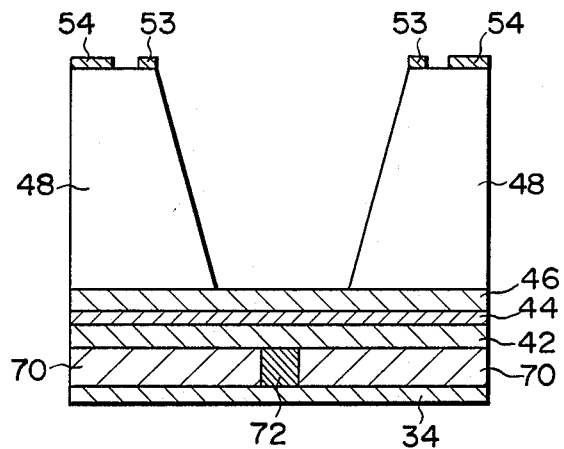
F I G. 5

SEMICONDUCTOR LIGHT EMITTING DEVICE

This application is a continuation of application Ser. No. 843,658 filed Mar. 26, 1986 now abandoned.

BACKGROUND OF THE INVENTION

The present invention relates to a solid state light emitting device and, more particularly, to a side surface emission type semiconductor light emitting device.

Semiconductor light emitting elements such as light emitting diodes and laser diodes have greatly contributed to the development of optical fiber communication techniques.

In optical fiber communication systems, the brightness of the light source is set at a desired value by controlling a drive current flowing through the semiconductor light emitting element The light output of the semiconductor light emitting diode is increased upon an increase in drive current. Conversely, when drive current decreases, light output is reduced accordingly. However, the light output of the semiconductor light emitting diode depends not only on drive current but also on a change of temperature or fatigue of the semiconductor light emitting element The light output from the element varies even if the drive current is constant. Recently, an automatic power controller has been used to stabilize the light output. This controller monitors changes in the intensity of light emitted from the semiconductor light emitting element and controls the drive current accordingly.

Conventional semiconductor light emitting elements are classified, in accordance with the direction of light emission, into two groups: edge emission type semiconductor light emitting elements and surface emission type semiconductor light emitting elements. In edge emission type semiconductor light emitting elements, light is emitted in a direction parallel to the pn-junction plane or substrate, and guided to an optical fiber cable. When a light emitting element of this type is optically coupled to the light receiving section of an automatic power controller, no problem occurs. This is because the optical fiber cable is coupled to one of the side surfaces of the semiconductor light emitting element and the light receiving section of the controller faces the other side of the light emitting element. Thus, a light beam emitted from the light emitting element can be directly received by the light receiving section.

In surface emission type semiconductor light emitting elements, a light beam is emitted in a direction perpendicular to the pn-junction plane or substrate, and guided to an optical fiber cable. In order to effectively guide the light beam to the optical fiber cable, reflection in directions other than the cable direction must be prevented. For this reason, when a surface emission type semiconductor light emitting element is optically coupled to the light receiving section of a power controller, an arrangement different from that used for the edge emission type semiconductor light emitting element is necessary. According to a known method, a beam splitter is arranged between the semiconductor light emitting element and the optical fiber cable. The beam splitter guides some of the light beams emitted from the light emitting element to the optical fiber cable, to the light receiving section of the automatic power controller.

Monitoring the light output from the surface emission type element, however, complicates the structure of the optical system such that the cost of manufacturing a light source unit constituted of a semiconductor light emitting element and a power controller is increased beyond that of a light source using an edge emission type element. Furthermore, a prior art surface emission type element is not positively used due to its low transmission efficiency compared with that of an edge emission type element.

SUMMARY OF THE INVENTION

It is an object of the present invention to provide a semiconductor light emitting device wherein an optical system for monitoring a light output from a surface emission type semiconductor light emitting element is simply arranged, and the light output from this element can be effectively utilized.

According to the present invention, there is provided a semiconductor light emitting device comprising a surface emission type semiconductor light emitting element section; a substrate with a through hole serving as a window through which a light beam generated by the light emitting element layer is emitted, the semiconductor substrate being in contact with the light emitting element section; and a photosensor which is formed in the substrate and facing the through hole to directly receive the light beam from the light emitting element section.

BRIEF DESCRIPTION OF THE DRAWINGS

FIG. 4 is a sectional view of a semiconductor light emitting device, with a MIS-type photosensor, constituting a second embodiment of the present invention; and FIG. 5 is a sectional view of a semiconductor light emitting device, with an MS-type photosensor and a current limiting structure different from that shown in FIG. 2, constituting a third embodiment of the present invention.

DETAILED DESCRIPTION OF THE PREFERRED EMBODIMENTS

Figure 2:
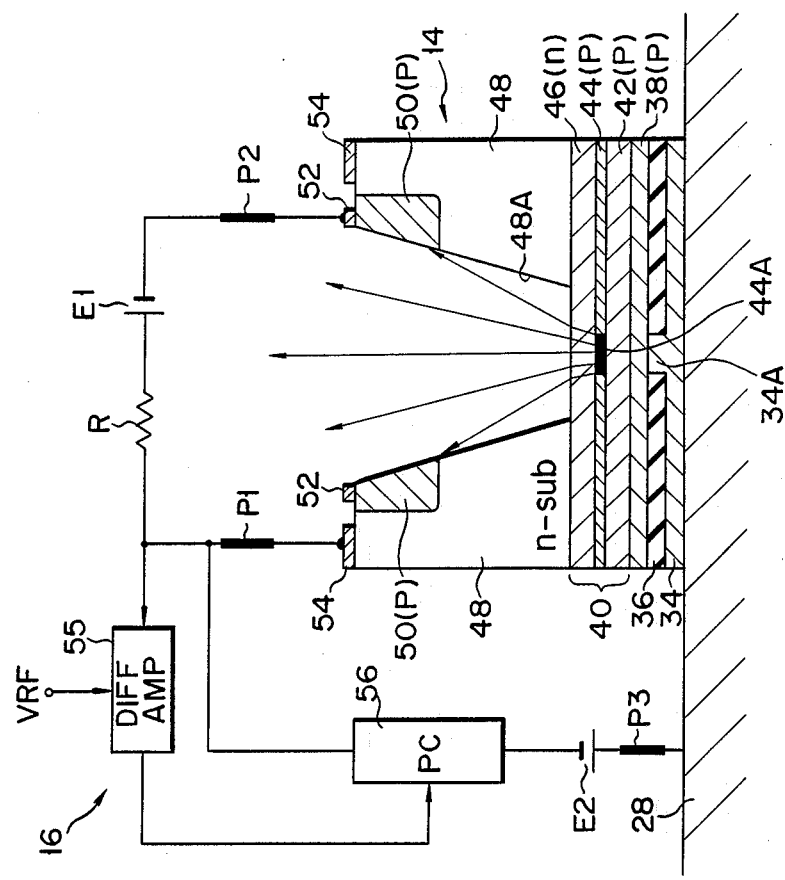
FIG. 2 is a schematic view showing semiconductor light emitting device 14 mounted in module 10 and a circuit for controlling the amount of light emitted by device 14.
Figure 1:
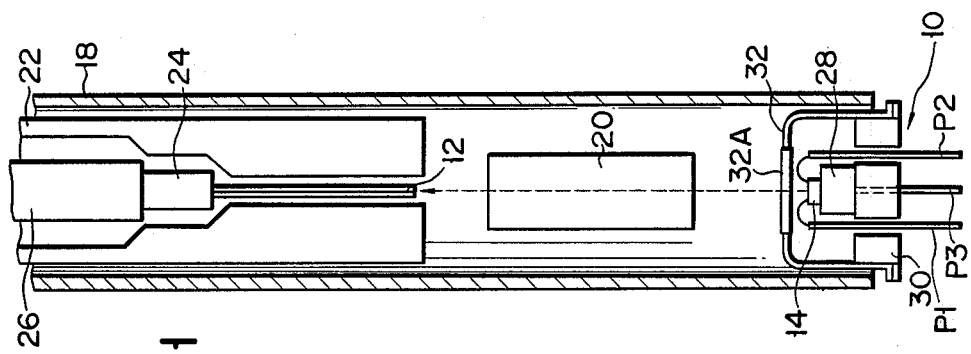
FIG. 1 is a sectional view showing connections between light emitting module 10 and optical fiber cable 12 so as to explain a first embodiment of the present invention.

A semiconductor light emitting device according to the first embodiment of the present invention will be described with reference to FIGS. 1 and 2. FIG. 1 shows a coupling relationship between light emitting module 10 and optical fiber cable 12. FIG. 2 shows semiconductor light emitting device 14 mounted in module 10, and light amount control circuit 16. As shown in FIG. 1, module 10 is inserted in one end of cylindrical holder 18 and fixed. Rod lens 20, which focuses light from unit 10, is fixed in cylindrical holder 18 at a position separated by a predetermined distance from module 10. Optical fiber cable 12 is inserted in cylindrical holder 18 via the end opposite that in which module 10 has been inserted, and receives the light focused by lens 20. Ferrule 22 is held in cylindrical holder 18 to support fiber cable 12. Cable 12 is covered with insulating film 24, and film 24 is covered with protective tube 26. Device 14 of module 10 is fixed to metal heat sink 28. Sink 28 is mounted on stem 30 having first, second and third conductive pins P1, P2 and P3. Pins P1 and P2 are directly connected to device 14, and pin P3 is electrically connected to device 14 through sink 28. Device 14 is covered with window cap 32 which is mounted on stem 30. Cap 32 has glass section 32A through which light emitted from device 14 is transmitted.

Device 14 has Au-Cr electrode layer 34 connected to sink 28. Layer 34 is covered with current limiting layer 36 of $SiO_2$, except for portion 34A, which serves as a current path. Portion 34A is in ohmic contact with p-type GaAs cap layer 38. Layer 38 is in contact with the bottom surface of light emitting section 40 of the double-heterostructure. A light beam emitted from section 40 to layer 36 is reflected by layer 38. Section 40 includes transparent cladding layer 42 formed on layer 38, active layer 44 formed on layer 42, and transparent cladding layer 46 formed on layer 44. Layers 42 and 46 are formed of p- and n-type $Al_xGa_{1-x}As$, respectively, and layer 44 is formed of p-type $Al_yGa_{1-y}As$ (wherein x and y have a relationship of $y < x$ so that the refractive index of layer 44 is higher than that of 1 of layers 42 and 46). Layer 46 of n-type GaAs is in contact with 100-μm thick semiconductor substrate 48. Portion 44A of layer 44 has a diameter of 20 to 30 μm and exclusively receives a drive current by means of portion 34A of layer 34, by which it emits light. Substrate 48 has window through hole 48A located above portion 44A of layer 44. Light emitted from section 40 is transmitted through this window to cable 12. The diameter of light emitting section 40 side is smaller than, for example, the 200 μm diameter of the optical fiber cable side.

The light emitting device further includes p-type region 50, formed in substrate 48, and facing hole 48A; Au-Cr electrode layer 52, formed in ohmic contact with region 50, and Au-Ge electrode layer 54, formed in ohmic contact with substrate 48. Region 50 and substrate 48 constitute a photodiode with an energy band gap lower than that of the light emitting wavelength of section 40. This photodiode is connected through electrodes 52 and 54 to a drive circuit with DC power source E1 and resistor R, and receives a reverse-biased voltage. When a light beam from section 40 is incident on region 50 through hole 48A, the photodiode generates a voltage signal, the magnitude of which is proportional to the intensity of the incident light.

The voltage signal is supplied to differential amplifier 55. Amplifier 55 compares the voltage signal with reference voltage VRF and supplies a difference output signal to power controller 56. Controller 56 is connected in series between layers 54 and 34 through DC power source E2. In response to the output signal from amplifier 55, controller 56 increases or decreases the drive current supplied from source E2 to section 40, thereby causing section 40 to generate a light beam of a constant intensity. Controller 56 includes, for example, a transistor for controlling the drive current in response to a base voltage supplied thereto. The drive current is blocked by layer 36 so that current is not supplied from layer 34 to the entire area of section 40, but, rather, is concentrated in portion 44A of layer 44 through portion 34A of layer 34. Therefore, light is emitted from portion 44A. The light is transmitted through layer 44 and can propagate toward hole 48A, but light beams are prevented from propagating in other directions by substrate 48 and layer 38.

Figure 3A:
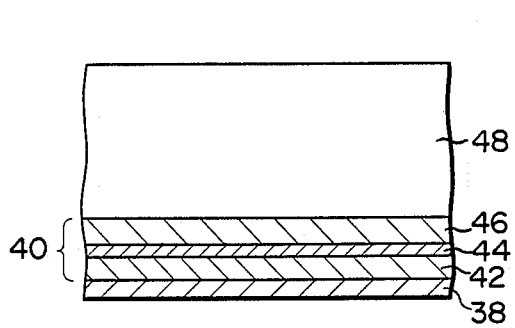
FIGS. 3A to 3K are sectional views explaining the steps in manufacturing device 14 as shown in FIG. 2.
Figure 3B:
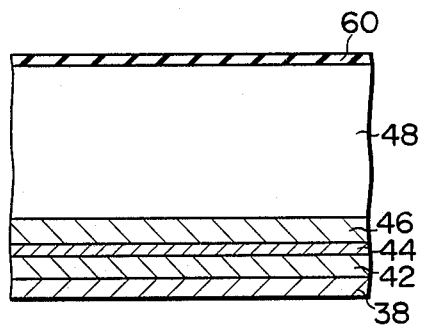
Figure 3C:
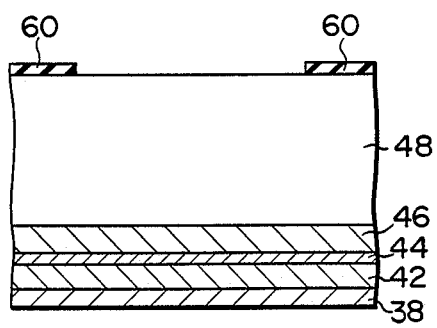

The steps in manufacturing device 14 will be described with reference to FIGS. 3A to 3K. In the first step, GaAs substrate 48 is prepared. Layers 46, 44, 42 and 38, shown in FIG. 3A, are sequentially formed on substrate 48 by an epitaxial growth method such as liquid phase growth or gas phase growth. Resist film 60 in FIG. 3B is formed to cover the entire surface of that part of substrate 48 not in contact with section 40.

Figure 3D:
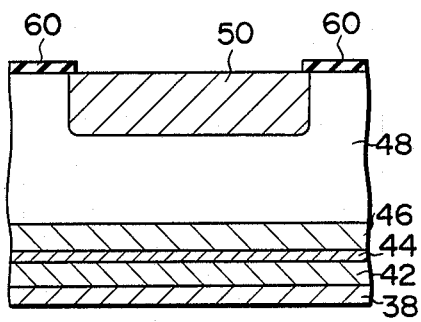
Figure 3E:
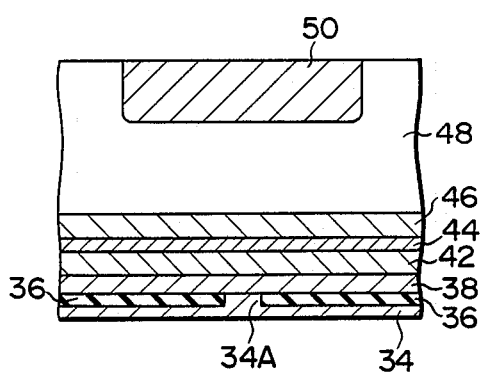
Figure 3F:
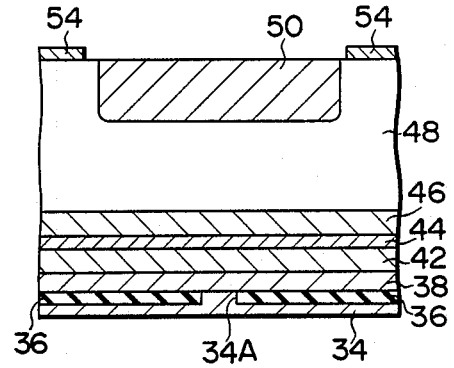

Part of film 60 is etched to expose the surface of substrate 48. A p-type impurity is implanted using film 60 as a mask, and is diffused in substrate 48 to form region 50, as shown in FIG. 3D. Thereafter, film 60 is removed, as shown in FIG. 3E. An $SiO_2$ film (not shown) is formed to cover layer 38. Part of the $SiO_2$ film is etched to expose the surface of layer 38. The residual $SiO_2$ film is used as layer 36. Au-Cr is then deposited on the exposed surfaces of layers 38 and 36 to form layer 34.

Figure 3G:
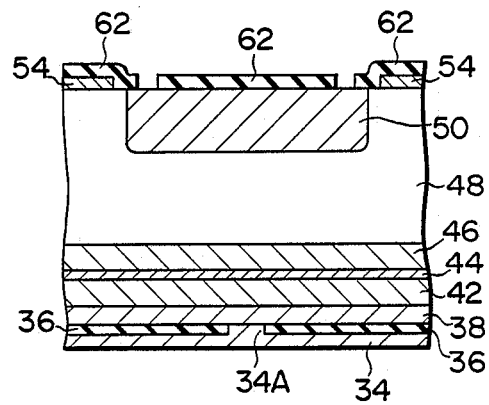
Figure 3H:
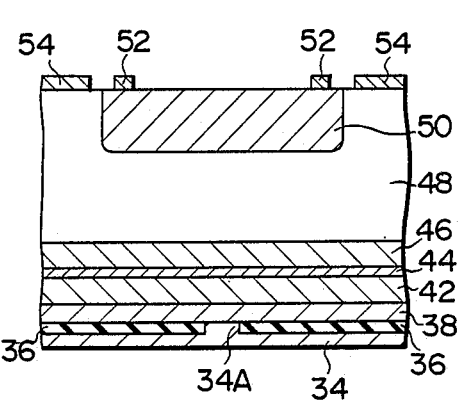
Figure 3I:
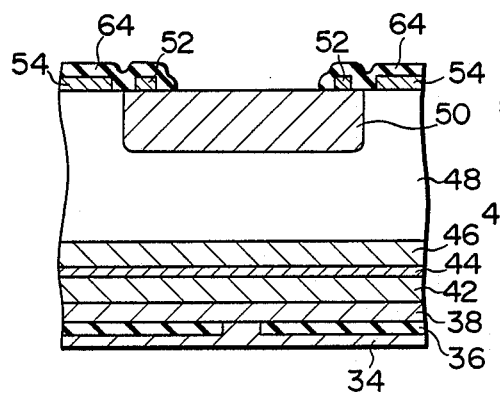

An Au-Ge layer (not shown) is then deposited on region 50 and substrate 48. Part of the Au-Ge layer is etched to expose the surface of region 50 and its periphery. The residual Au-Ge layer serves as layer 54. The exposed surfaces of layer 54, region 50 and substrate 48 are covered with resist film 62. Film 62 is patterned to form an annular groove at a boundary between region 50 and substrate 48, as shown in FIG. 3G. Au-Cr is deposited on film 62 and in the annular groove and is then dissolved to form annular electrode layer 52 on the p-type region, as shown in FIG. 3H. The exposed surfaces of layers 52 and 54, region 50 and substrate 48 are covered with resist film 64. Film 64 is patterned to expose the p-type region surrounded by layer 52, as shown in FIG. 3I.

Figure 3J:
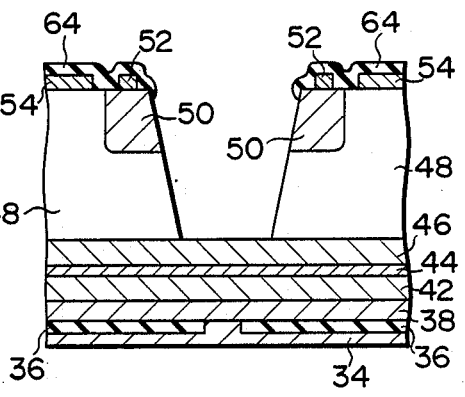
Figure 3K:
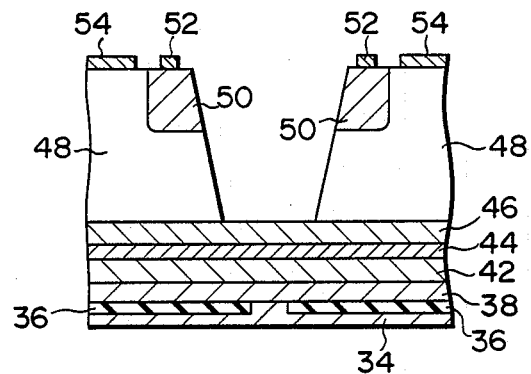

Region 50 and substrate 48 are etched using film 64 as a mask to partially expose layer 46, as shown in FIG. 3J. An $NH_3$-$H_2O_2$ based etchant is used in this etching process. The resultant V-wall corresponds to the through hole 48A in FIG. 2. Film 64 is removed, and device 14 is complete.

Layer 34 is welded to, for example, Cu heat sink 28. Sink 28 causes the drive current to flow in layer 34 and dissipates heat from the semiconductor light emitting device to the outside. Section 40 and substrate 48 constitute a Burrus LED. Region 50 and substrate 48 constitute a photodiode. Layers 34 and 54 serve as the anode and cathode of the LED, respectively. Layers 52 and 54 serve as the cathode and anode of the photodiode, respectively. Layers 54, 52 and 34 are connected through pins P1, P2 and P3 (FIG. 2) to control circuit 15 which is arranged outside module 10.

In operation, when a voltage is supplied from circuit 16 to layers 34 and 54, the drive current flows through portion 34A of layer 34, section 40 and substrate 48. Light is emitted from layer 44 above portion 34A of layer 34 in accordance with the magnitude of the drive current. Light is emitted outside through hole 48A, as shown in FIG. 2, and is guided to cable 12 through lens 20 (FIG. 1). Some of the light beams emitted outside hole 48A are incident on region 50. The photodiode comprised of region 50 and substrate 48 generates a voltage signal proportional to the intensity of incident light. The voltage signal is monitored by circuit 16. In circuit 16, amplifier 55 compares the voltage signal with reference voltage VRF. When the input signal voltage is higher than voltage VRF, amplifier 55 generates a high level signal; if lower, a low level signal. Controller 56 decreases or increases the drive signal in response to the high and low level signals from amplifier 55, respectively. The light output from section 40 is thus kept constant. Since voltage VRF can be changed as needed, the light output from section 40 can be stabilized at an arbitrary level.

According to this embodiment, since part of the photodiode, i.e., region 50, faces hole 48A as a window for the output light from section 40, and is formed in substrate 48, no problem occurs when the output light from section 40 is guided to the optical fiber cable. In addition, the cable can directly receive light at a position near to section 40. Therefore, changes in the intensity of output light from section 40 can be constantly and precisely monitored. Since region 50 is formed in substrate 48, the fabrication process can be simplified. Unlike expensive conventional optical systems wherein the output light from section 40 is split and guided by a beam splitter or the like to the light receiving element, the optical system of this embodiment can be prepared at low cost. Surface emission type type semiconductor light-emitting devices can, therefore, be more effectively utilized.

As shown in FIG. 2, in the above embodiment region 50 is formed in part of the surface area of substrate 48. However, the entire surface area of substrate 48 can be occupied by region 50. In this case, layer 54 is formed on a side surface of substrate 48.

FIG. 4 shows another embodiment, wherein the photodiode in device 14 of FIG. 2 is replaced with an MIS structure. The same reference numerals in FIG. 4 denote the same parts as in the previous embodiment. Referring to FIG. 4, insulating layer 68 of $SiO_2$ or $Si_3N_4$ is formed on substrate 48 in annular fashion, and Au gate electrode layer 66 is formed on layer 68. In this case, substrate 48, layer 66 and layer 68 constitute a photosensor, and a reverse-bias voltage is supplied to the electrode layers 54 and 66. When output light from section 40 is incident on the insulated junction between substrate 48 and layer 68, the photosensor generates an output signal, the magnitude of which is proportional to the intensity of the incident light. Region 50 in FIG. 2 is omitted in the device of FIG. 4. The same effect as with the previous embodiment can be obtained with the device of FIG. 4.

FIG. 5 shows still another embodiment, wherein the photodiode in device 14 of FIG. 2 is replaced with an MS structure. The same reference numerals in FIG. 5 denote the same parts as in the first embodiment. The device has Au electrode layer 53 in place of Au-Cr electrode layer 52. Layer 53 has an annular shape and is formed in Schottky contact with substrate 48. In this case, layer 53 and substrate 48 constitute a photosensor, and a reverse-bias voltage is supplied to electrode layers 53 and 54). When output light from section 40 is incident on the junction between substrate 48 and layer 53, the photosensor generates an output signal, the magnitude of which is proportional to the intensity of the incident light.

Layer 38 and region 50 in FIG. 2 is omitted in the device of FIG. 5. The device in FIG. 5 has n-type GaAs layer 70 in place of FIG. 2's $SiO_2$ layer 36. Layer 70 is formed between cladding layer 42 and electrode layer 34. Layer 70 has the same opening as that of layer 36 in FIG. 1. A p-type GaAs layer 72 is formed within the opening in place of FIG. 1's portion 34A electrode 34. Layer contacts with layer 42 and electrode 34 to serve as a drive current path.

The same effect as with the first embodiment can be obtained with this embodiment.

According to the present invention, an optical system for monitoring a light output from a surface emission type semiconductor light emitting element can be simplified, and the light output from the light emitting element can be effectively utilized.

What is claimed is:

1. A semiconductor light emitting device comprising:
   a semiconductor substrate;
   a window formed in said semiconductor substrate;
   a double-hetero type light emitting means, formed on said semiconductor substrate, said means being thinner than a thickness of said semiconductor substrate, for emitting a light beam perpendicularly to said semiconductor substrate through said window.
   photosensing means formed in said semiconductor substrate and facing said window, for receiving the emitted light and for generating an electrical signal in accordance with an intensity of the admitted light; and
   heat sink means coupled to said light emitting structure for dissipating heat therefrom.

2. A device according to claim 1, wherein said light emitting means includes a light emitting section including a first cladding layer of a first conductivity type epitaxially grown on said semiconductor substrate of said first conductivity type, an active layer of a second conductivity type epitaxially grown on said first cladding layer, and a second cladding layer of said second conductivity type epitaxially grown on said active layer.

3. A device according to claim 2, wherein said semiconductor substrate is comprised of GaAs, and said light emitting section is comprised of AlGaAs.

4. A device according to claim 2, wherein said light emitting structure further includes current limiting means for concentrating the flow of a drive current to a portion of said active layer which is located within the area defined by said window.

5. A device according to claim 4, wherein said current limiting means includes a cap layer of the second conductivity type formed on said second cladding layer, an insulating layer formed on said cap layer and having an opening, and an electrode layer formed on said insulating layer and contacting said cap layer via said opening.

6. A device according to claim 5, wherein said photosensing means includes a photosensor including a part of said semiconductor substrate and a region formed in pn-contact with the part of said semiconductor substrate.

7. A device according to claim 5, wherein said photosensing means includes a photosensor including a part of said semiconductor substrate and an electrode formed over and insulated from the part of said semiconductor substrate.

8. A device according to claim 4, wherein said current limiting means includes a block layer of the first conductivity type formed on said second cladding layer and having an opening and a path layer of the second conductivity type formed in said opening and in contact with said second cladding layer, and an electrode layer formed on said path and block layers.

9. A device according to claim 8, wherein said photosensing means includes a photosensor including a part of said semiconductor substrate and an electrode formed in Schottky contact with the part of said semiconductor substrate.

10. A device according to claim 1, wherein said photosensing means includes a photosensor including a part of said semiconductor substrate and a region formed in pn-contact with the part of said semiconductor substrate.

11. A device according to claim 1, wherein said photosensing means includes a photosensor including a part of said semiconductor substrate and an electrode formed in Schottky contact with the part of said semiconductor substrate.

12. A device according to claim 1, wherein said photosensing means includes a photosensor including a part of said semiconductor substrate and an electrode formed over and insulated from the part of said semiconductor substrate.

* * * * *